US010727160B2

(12) United States Patent
Kulkarni et al.

(10) Patent No.: US 10,727,160 B2
(45) Date of Patent: Jul. 28, 2020

(54) THERMAL MANAGEMENT COMPONENT

(71) Applicant: Intel Corporation, Santa Clara, CA (US)

(72) Inventors: Devdatta P. Kulkarni, Portland, OR (US); Richard J. Dischler, Bolton, MA (US); Je-Young Chang, Phoenix, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 15/859,236

(22) Filed: Dec. 29, 2017

(65) Prior Publication Data

US 2019/0206764 A1 Jul. 4, 2019

(51) Int. Cl.
*H01L 23/433* (2006.01)
*H01L 23/367* (2006.01)
(Continued)

(52) U.S. Cl.
CPC ........ *H01L 23/433* (2013.01); *H01L 23/3675* (2013.01); *H01L 23/427* (2013.01); *H01L 23/367* (2013.01); *H01L 24/16* (2013.01); *H01L 24/32* (2013.01); *H01L 24/73* (2013.01); *H01L 2224/16225* (2013.01); *H01L 2224/32245* (2013.01); *H01L 2224/73253* (2013.01)

(58) Field of Classification Search
CPC . H01L 2224/16225; H01L 2224/32245; H01L 2224/73253; H01L 24/16; H01L 24/32; H01L 24/73; H01L 23/367; H01L 23/3675; H01L 23/433; H01L 23/427
See application file for complete search history.

(56) References Cited

U.S. PATENT DOCUMENTS 5,291,064 A 3/1994 Kurokawa
5,345,107 A 9/1994 Daikoku
(Continued)

OTHER PUBLICATIONS

U.S. Appl. No. 15/637,439, filed Jun. 29, 2017; Devadatta P. Kulkarni.

*Primary Examiner* — Bilkis Jahan
*Assistant Examiner* — Victor V Barzykin
(74) *Attorney, Agent, or Firm* — Schwabe, Williamson & Wyatt, P.C.

(57) ABSTRACT

Thermal management technology is disclosed. A thermal management component in accordance with the present disclosure can comprise a heat spreader having a plurality of microchannels. The thermal management component can also comprise a plurality of fins directly coupled to the heat spreader to provide surface area for heat transfer. In another aspect, a thermal management component can comprise a heat spreader having a plurality of microchannels, and an inlet port and an outlet port in fluid communication with the plurality of microchannels. The thermal management component can also comprise a plurality of fins coupled to the heat spreader to provide surface area for heat transfer. Additionally, the thermal management component can comprise a fluid conduit thermally coupled to the plurality of fins and fluidly coupled to the outlet port and the inlet port to facilitate flow of a heat transfer fluid through the microchannels and the fluid conduit. Associated electronic devices, systems, and methods are also disclosed.

18 Claims, 7 Drawing Sheets

(51) Int. Cl.
*H01L 23/427* (2006.01)
*H01L 23/00* (2006.01)

(56) References Cited

U.S. PATENT DOCUMENTS

| | | | | |
|---|---|---|---|---|
| 5,705,850 | A * | 1/1998 | Ashiwake | H01L 23/4338 |
| | | | | 257/706 |
| 5,801,442 | A | 9/1998 | Hamilton | |
| 6,317,326 | B1 | 11/2001 | Vogel | |
| 6,942,018 | B2 * | 9/2005 | Goodson | F04B 19/006 |
| | | | | 165/104.21 |
| 7,661,463 | B2 * | 2/2010 | Liu | H01L 23/427 |
| | | | | 165/104.14 |
| 7,819,914 | B2 | 10/2010 | Dave et al. | |
| 8,058,724 | B2 * | 11/2011 | Refai-Ahmed | H01L 23/3732 |
| | | | | 257/706 |
| 9,653,378 | B2 | 5/2017 | Hou et al. | |
| 2004/0061218 | A1 | 4/2004 | Tilton | |
| 2005/0068725 | A1 * | 3/2005 | Houle | H01L 21/4878 |
| | | | | 361/688 |
| 2005/0146021 | A1 | 7/2005 | Edwards | |
| 2008/0174963 | A1 * | 7/2008 | Chang | F28D 15/0233 |
| | | | | 361/700 |
| 2009/0140417 | A1 * | 6/2009 | Refai-Ahmed | H01L 23/3732 |
| | | | | 257/707 |
| 2010/0039777 | A1 | 2/2010 | Houle | |
| 2010/0128436 | A1 * | 5/2010 | Edmunds | H01L 23/427 |
| | | | | 361/700 |
| 2012/0152498 | A1 * | 6/2012 | Lyon | F28D 15/00 |
| | | | | 165/104.31 |
| 2013/0299133 | A1 | 11/2013 | Li | |
| 2017/0229377 | A1 | 8/2017 | Ellsworth | |

* cited by examiner

THERMAL MANAGEMENT COMPONENT

TECHNICAL FIELD

Embodiments described herein relate generally to electronic devices, and more particularly to cooling components of electronic devices to prevent overheating.

BACKGROUND

Power requirements are increasing for electronic devices, such as those utilized in servers, with corresponding increases in thermal design power (TDP), which is a metric to ensure that the maximum amount of heat generated by a computer chip or component (often the CPU or GPU) can be dissipated by the cooling system. In addition, electronic devices often include packages with multiple electronic components that must be cooled by the same thermal solution. Traditionally, an integrated heat spreader (IHS), which is typically a metallic (e.g., copper) plate, has been utilized as a package lid that can spread heat to a heat sink (e.g., air-cooled fins). A viscous thermal interface material (TIM) is typically utilized at the IHS/heat sink junction to thermally couple the IHS and heat sink.

BRIEF DESCRIPTION OF THE DRAWINGS

Technology features and advantages will be apparent from the detailed description which follows, taken in conjunction with the accompanying drawings, which together illustrate, by way of example, various technology embodiments; and, wherein.

Figure 1A:
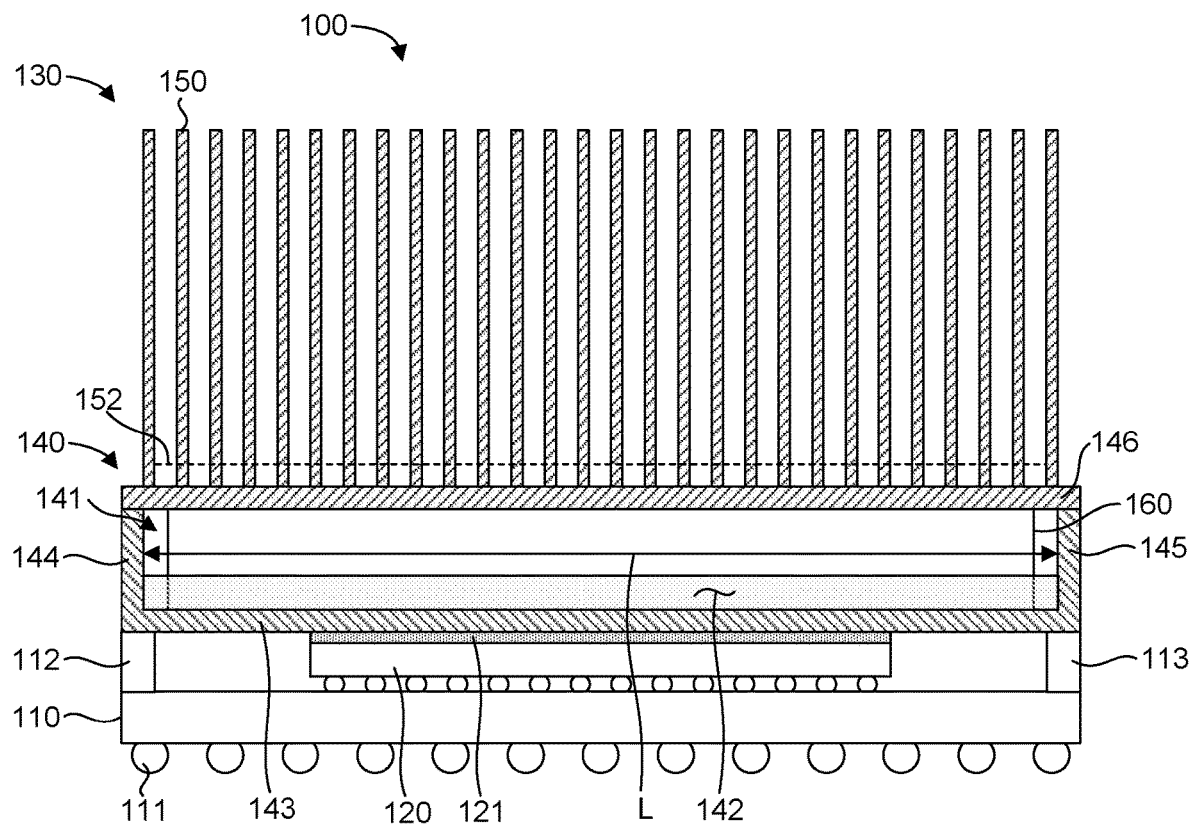
FIG. 1A illustrates a schematic cross-section of an electronic device in accordance with an example embodiment.

Reference will now be made to the exemplary embodiments illustrated, and specific language will be used herein to describe the same. It will nevertheless be understood that no limitation of the scope or to specific technology embodiments is thereby intended.

DESCRIPTION OF EMBODIMENTS

Before specific technology embodiments are disclosed and described, it is to be understood that no limitation to the particular structures, process steps, or materials disclosed herein is intended, but also includes equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence. Unless defined otherwise, all technical and scientific terms used herein have the same meaning as commonly understood by one of ordinary skill in the art to which this disclosure belongs.

As used in this written description, the singular forms "a," "an" and "the" provide express support for plural referents unless the context clearly dictates otherwise. Thus, for example, reference to "a layer" includes a plurality of such layers.

In this application, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open ended term in the written description like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

The term "coupled," as used herein, is defined as directly or indirectly connected in an electrical or nonelectrical manner. "Directly coupled" items or objects are in physical contact and attached to one another. Objects described herein as being "adjacent to" each other may be in physical contact with each other, in close proximity to each other, or in the same general region or area as each other, as appropriate for the context in which the phrase is used.

Occurrences of the phrase "in one embodiment," or "in one aspect," herein do not necessarily all refer to the same embodiment or aspect.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, sizes, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Furthermore, the described features, structures, or characteristics may be combined in any suitable manner in one or more embodiments. In this description, numerous specific details are provided, such as examples of layouts, distances, network examples, etc. One skilled in the relevant art will recognize, however, that many variations are possible without one or more of the specific details, or with other methods, components, layouts, measurements, etc. In other instances, well-known structures, materials, or operations are not shown or described in detail but are considered well within the scope of the disclosure.

Example Embodiments

An initial overview of technology embodiments is provided below and specific technology embodiments are then described in further detail. This initial summary is intended to aid readers in understanding the technology more quickly but is not intended to identify key or essential features of the technology nor is it intended to limit the scope of the claimed subject matter.

Currently, higher TDP packages (i.e., greater than 165 W) with air-cooled thermal solutions in data center applications are facing challenges with regard to server density, and therefore server and rack level performance. Current air-cooled thermal solutions require a drastic reduction in package density in order to adequately cool higher TDP packages. If higher TDP packages are to be utilized, end users may be forced to invest in new infrastructure, such as additional chassis, motherboards, cooling capabilities (e.g., additional air-cooling, or forced liquid cooling as an alternative), and other accessories. Although forced liquid cooling can achieve the package density required for increasing standards of high performance computing (HPC), forced liquid cooling comes at the cost of infrastructure investment. Forced liquid cooling also presents potential challenges, such as loss of availability due to liquid leakage, which is a concern with the complex and relatively lengthy fluid routing employed in many forced liquid cooling systems. An air-cooled thermal solution that can support higher TDP packages is therefore desirable for many end users.

Accordingly, a thermal management component is disclosed that provides an air-cooled thermal solution, which can support higher TDP packages. In one example, a thermal management component in accordance with the present disclosure can comprise a heat spreader having a plurality of microchannels. The thermal management component can also comprise a plurality of fins directly coupled to the heat spreader to provide surface area for heat transfer. In another example, a thermal management component can comprise a heat spreader having a plurality of microchannels, and an inlet port and an outlet port in fluid communication with the plurality of microchannels. The thermal management component can also comprise a plurality of fins coupled to the heat spreader to provide surface area for heat transfer. Additionally, the thermal management component can comprise a fluid conduit thermally coupled to the plurality of fins and fluidly coupled to the outlet port and the inlet port to facilitate flow of a heat transfer fluid through the microchannels and the fluid conduit. Associated electronic devices, systems, and methods are also disclosed.

Referring to FIG. 1A, an exemplary electronic device 100 is schematically illustrated in cross-section. The electronic device 100 can include a substrate 110. The electronic device 100 can also include one or more active components 120 disposed on and electrically coupled to (e.g., mounted on) the substrate 110. In addition, the electronic device 100 can include a thermal management component 130 thermally coupled to the active component 120. The thermal management component 130 is shown isolated in FIG. 1B, which illustrates a cross-section view orthogonal to the view in FIG. 1A.

The active component 120 can be operable to generate heat (e.g. due to resistance of electric current). Thus, for example, the active component 120 can be any electronic component or electronic device that may be included in an electronic device, such as a semiconductor device (e.g., a die, a chip, a processor, computer memory, a platform controller hub, etc.). In one embodiment, an active component may represent a discrete chip, which may include an integrated circuit. The active component may be, include, or be a part of a processor (e.g., a CPU, a GPU, etc.), a computer memory device (e.g., ROM, SRAM, DRAM, flash memory, EEPROM, etc.), an application specific integrated circuit (ASIC), a platform controller hub (PCH), a field programmable gate array (FPGA), a modem, a system on a chip (SOC), a system in a package (SIP), or a package on a package (POP) in some embodiments. An active component can be any passive electronic device or component, such as a capacitor, resistor, etc. It should be recognized that any suitable number of electronic components can be included.

The substrate 110 may be of any suitable construction or material. For example, the substrate 110 may include typical substrate materials. In some embodiments, the substrate 110 may be configured as an epoxy-based laminate substrate having a core and/or build-up layers. The substrate 110 may be configured as other suitable types of substrates in other embodiments. For example, the substrate can be formed primarily of any suitable semiconductor material (e.g., a silicon, gallium, indium, germanium, or variations or combinations thereof, among other substrates), one or more insulating layers, such as glass-reinforced epoxy, such as FR-4, polytetrafluoroethylene (Teflon), cotton-paper reinforced epoxy (CEM-3), phenolic-glass (G3), paper-phenolic (FR-1 or FR-2), polyester-glass (CEM-5), ABF (Ajinomoto Build-up Film), any other dielectric material, such as glass, or any combination thereof, such as can be used in printed circuit boards (PCBs). In some embodiments, the substrate 110 can be constructed primarily of silicon and/or may be configured as an interposer or a redistribution layer (RDL).

The active component can be electrically coupled to the substrate 110 according to a variety of suitable configurations including a flip-chip configuration, wire bonding, and the like. One or more of the active components can be electrically coupled to the substrate 110 using interconnect structures (e.g., solder balls or bumps and/or wire bonds) configured to route electrical signals between the active components and the substrate 110. In some embodiments, the interconnect structures may be configured to route electrical signals such as, for example, I/O signals and/or power or ground signals associated with the operation of the active components. In some embodiments, multiple active components can be part of a "multi-chip" package. In one aspect, active components can be in a side-by-side relationship. In another aspect, multiple active components can be in a stacked relationship, for example, to save space and enable smaller form factors. It should be recognized that any suitable number of active components can be included in a stack. At least some of the stacked active components can be wirebond based integrated circuits (e.g., ASIC, DRAM, and NAND). Such wirebond based integrated circuits can be electrically coupled to one another by wirebond connections.

The substrate 110 may include electrically conductive elements or electrical routing features configured to route electrical signals to or from the electronic components. The electrical routing features may be internal (e.g., disposed at least partially within a thickness of the substrate 110) and/or external to the substrate 110. For example, in some embodiments, the substrate 110 may include electrical routing features such as pads, vias, and/or traces configured to receive the interconnect structures and route electrical signals to or from the electronic components. The pads, vias, and traces can be constructed of the same or similar electrically conductive materials, or of different electrically conductive materials. Any suitable electrically conductive material can be utilized, such as copper, gold, etc. In some embodiments, the substrate 110 can include a solder resist material or other surface treatment forming an outer layer of the substrate. The electronic device 100 can also include interconnect structures 111, such as solder balls, coupled to a bottom side of the substrate 110 to facilitate electrically coupling the electronic device 100 with an external electronic component, such as a next level component (e.g., a substrate or circuit board such as a motherboard) for power and/or signaling.

In general, the thermal management component 130 can include a heat spreader 140, and one or more heat transfer fins 150 coupled to the heat spreader 140 to provide surface area for convective heat transfer, such as with ambient air, which may be blown or forced past the fins 150 by a fan. The heat spreader 140 can "spread out" heat over its geometry so that the fins 150 may be more fully utilized. The fins 150 can be constructed of any suitable thermally conductive material, such as aluminum, copper, steel, etc. in any combination.

Although the thermal management component 130 may be considered an "air-cooled" thermal solution due to the fins 150, typically, the thermal management component 130 will also utilize an internal heat transfer or working fluid to facilitate cooling the active component 120. For example, the thermal management component 130 can be configured to take advantage of the fact that changing a phase of a fluid from a liquid to a vapor requires a significant amount of energy, known as latent heat, or heat of vaporization. As a result, a large amount of heat can be removed from the fluid by returning the vapor phase back to liquid. Accordingly, the heat spreader 140 can be or include any suitable type of thermal structure that can include or utilize an internal heat transfer fluid.

In some embodiments, the heat spreader 140 can be or include a lid for an electronic device package, an integrated heat spreader (IHS), a vapor chamber, a heat exchanger, etc. In the embodiment shown in FIGS. 1A and 1B, the heat spreader 140 includes an opening or cavity 141 that can include a heat transfer fluid 142. In this case, the heat transfer fluid 142 is confined to the cavity 141, and the heat spreader 130 may include a vapor chamber heat exchanger in which liquid heat transfer fluid 142 boils and vaporizes changing to the gas phase. Vapor spreads over the inner surfaces of the cavity 141 where the heat transfer fluid 142 cools and condenses to liquid and returns to the bottom of the cavity 141. In addition, the heat spreader 140 may be operable with walls 112, 113, which may be incorporated into, or distinct from, the heat spreader 140 to form an enclosure about the active component 120. Thus, the heat spreader 140 can be an IHS and/or form a lid for an electronic device package (e.g., a processor package). The heat spreader 140 can be constructed of any suitable thermally conductive material or combination of materials, such as aluminum, copper, steel, diamond, ceramic, silicon, etc. alone or in any combination.

In one aspect, the cavity 141 can be formed by a bottom plate 143, sidewalls 144, 145, and a top plate 146. In the illustrated embodiment, the bottom plate 143 and sidewalls 144, 145 are integrally formed with one another, and the top plate 146 is attached to the sidewalls 144, 145, such as with solder material, braze material, an adhesive, etc. to form a seal (e.g., a hermetic seal) to prevent escape of the heat transfer fluid 142 from the cavity 141 via the attachment junction. Although the top plate 146 is illustrated as being a separate and distinct component from the sidewalls 144, 145 and bottom plate 143, it should be recognized that the bottom plate 143, sidewalls 144, 145, and/or top plate 146 can be integrally formed or separate and distinct components as desired or expedient.

Figure 1B:
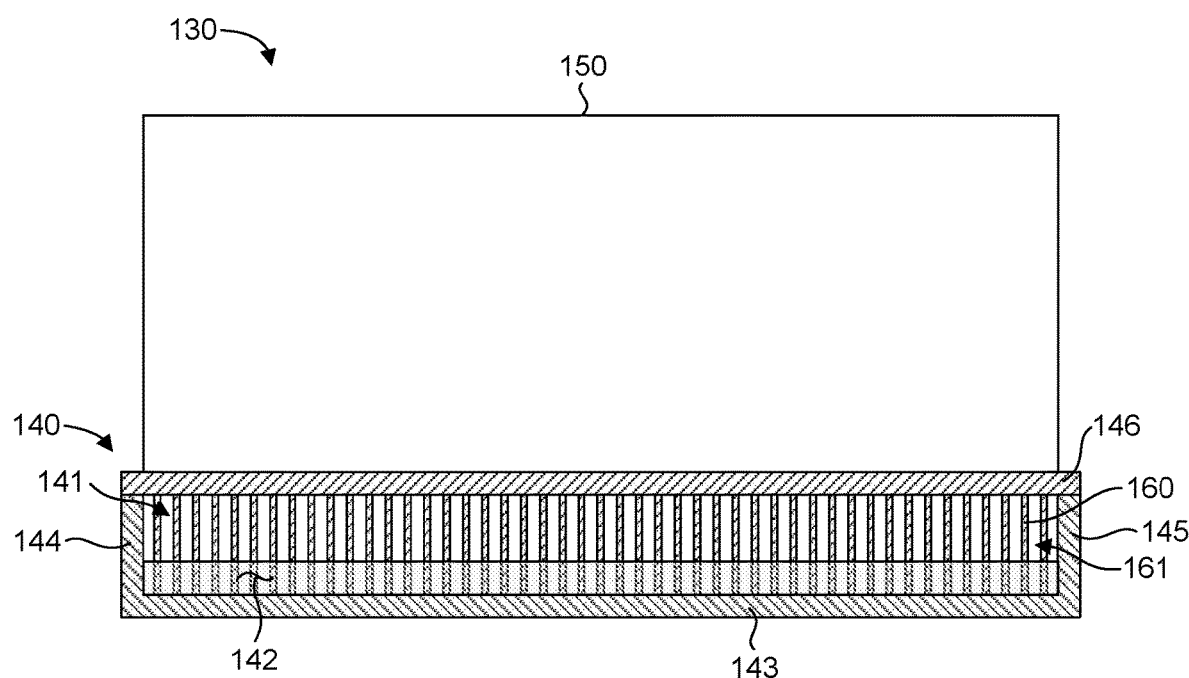
FIG. 1B illustrates a schematic cross-section of a thermal management component of the electronic device of FIG. 1A in accordance with an example embodiment.

In some embodiments, the heat spreader 140 can include heat transfer fins (e.g., microfins) 160 disposed in the cavity 141, which can at least partially define microchannels 161 (FIG. 1B). The heat transfer fluid 142 can be disposed in the microchannels 161 to facilitate heat transfer within the thermal management component 130. As used herein, a "heat transfer fin" is any feature that provides one or more extended surfaces that protrude from a base surface or body to increase heat transfer area and thereby increase heat transfer rate between the base surface or body and a surrounding fluid by increasing convection. Where a heat transfer fin is exposed to a flowing fluid (e.g., a liquid and/or a gas), the heat transfer fin can be any suitable fluid interrupter that provides surface area and increases time of residence for the fluid over the surface area in order to transfer heat energy. A heat transfer fin can have any suitable shape or configuration, such as longitudinal fin configuration, a radial fin configuration, and/or a pin fin configuration. A heat transfer fin can have a constant (e.g., rectangular) or variable (e.g., trapezoidal, concave parabolic, and triangular) cross-sectional area profile extending from a base surface or body. Typically, the heat transfer fins 150 will be designed to transfer heat to a gas (e.g., air), and the heat transfer fins 160 will be designed to transfer heat to a liquid.

Any suitable heat transfer fluid 142 can be utilized in the thermal management component 130. In some embodiments, the thermal management component 130 may be designed to utilize a two-phase heat exchange mechanism. In this case, any suitable heat transfer fluid can be utilized that can undergo phase change between liquid and gas during use. In some embodiments, water, a refrigerant, methanol, etc. may be used as a heat transfer fluid. In some embodiments, the heat transfer fluid may be a dielectric fluid to minimize damage to surrounding electronic devices in the event of a heat transfer fluid leak.

Figure 2:
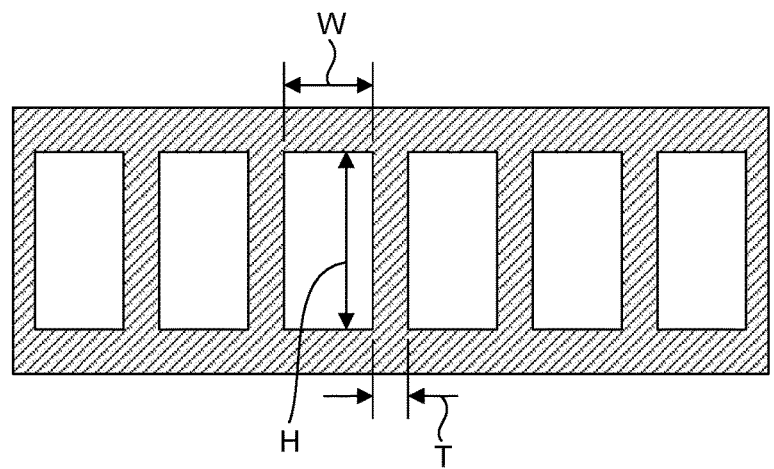
FIG. 2 illustrates microchannel geometry in accordance with an example embodiment.

Various aspects of the thermal management component 130 may be designed to improve heat transfer in accordance with heat transfer fluid properties. For example, microchannel geometry is illustrated in FIG. 2, which shows microchannels having rectangular shaped cross-sectional areas of width W and height H. The microchannels are separated by microfins of thickness T. The microchannels and microfins have a length L (FIG. 1B). The microchannels and microfins can have any suitable dimensions. For example, a microchannel can have a width W of from about 20 µm to about 500 µm and a height H of from about 20 µm to about 10 mm. A microfin can have a thickness T of from about 20 µm to about 500 µm. The number of parallel microchannels and the length L of the microchannels and microfins may depend on the overall size or area of the heat spreader 140. The heat spreader 140 can have a shape that generally corresponds to the active component 120 or group of active components to which the heat spreader 140 is thermally coupled. The microchannels, in some embodiments, can have an aspect ratio H:W of 1:1, 10:1, or up to 20:1 or more. In some cases, the microchannels can be made as deep as it is economical to make them, in order to increase the surface area of microfins exposed to the heat transfer fluid, thus enhancing heat transfer.

In general, the microchannel configuration for a particular implementation will be a function of the heat transfer parameters (e.g., thermal coefficients, material thickness, heat dissipation requirements, thermal characteristics of the heat transfer fluid, etc.), heat transfer fluid characteristics (e.g., temperature, pressure, viscosity, etc.), and active component and/or heat spreader area. Although depicted as rectangular in configuration in the figures herein, the actual shape of the microchannels may include radiused profiles, or may even have substantially circular or oval profiles. One embodiment may be designed to include microchannels of varying width, length, and/or height in relationship with each other.

With further reference to FIGS. 1A and 1B, the heat transfer fins 160 can be included with a channel base, which is coupleable to a cover that is operable with the fins 160 to define the microchannels 161. The fins 160 can be integrally formed with the channel base, which may facilitate manufacture of the fins. The fins 160 can be manufactured utilizing any suitable technique or process, such as casting, forging, machining, skiving, broaching, electrical discharge machining, etching, etc. In the illustrated embodiment, the fins 160 can be included with the top plate 146 to form a channel base. The bottom plate 143 and sidewalls 144, 145 can form a cover that cooperates with the fins 160 and the top plate 146 of the channel base to define the microchannels 161. On the other hand, the fins 160 can be included with the bottom plate 143 and sidewalls 144, 145 to form a channel base. In this case, the top plate 146 can form a cover that is operable with the fins 160, the bottom plate 143, and sidewalls 144, 145 to define the microchannels 161. The fins 160 can be fixed at opposite ends to the bottom and top plates 143, 146, such as by being integrally formed with one or both plates, soldered, brazed, bonded (e.g., with a thermal adhesive), etc. Such a fixed end configuration of the fins 160 can provide the heat spreader 140 with relatively high stiffness, which may be suitable to withstand socket loading requirements during assembly.

Figure 3:
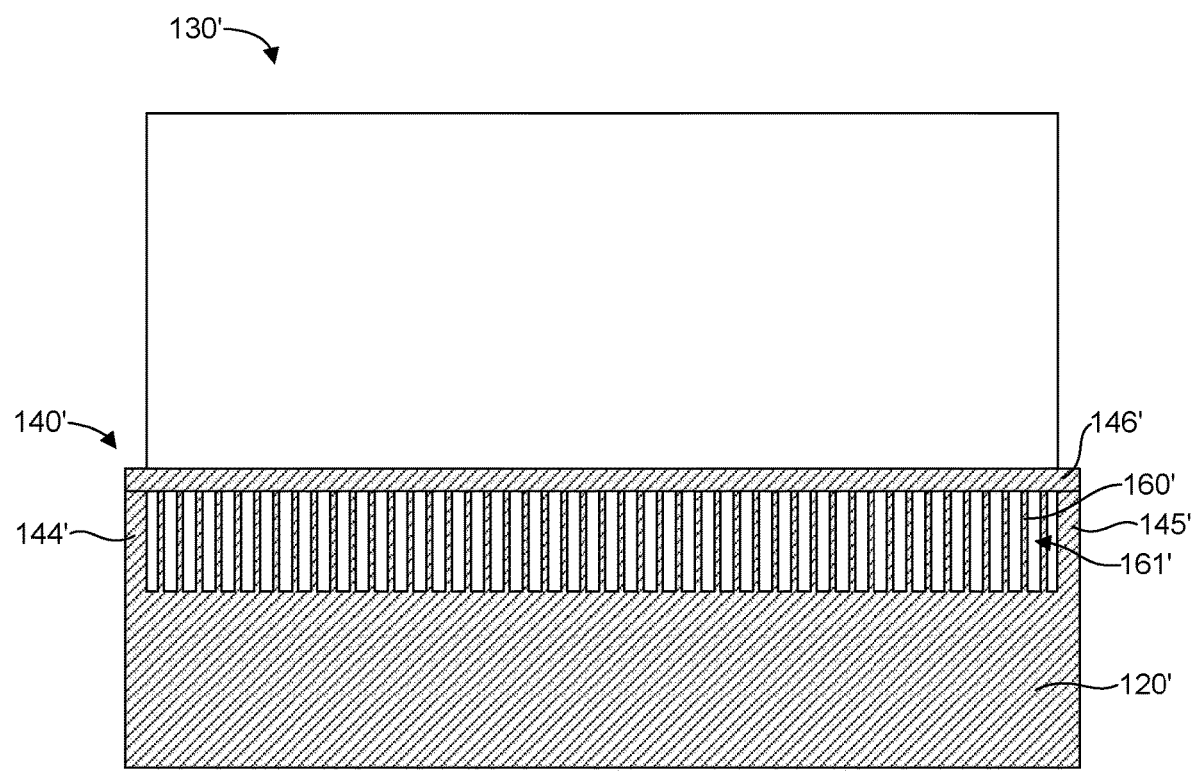
FIG. 3 illustrates a schematic cross-section of a thermal management component in accordance with an example embodiment.

A thermal management component 130' with an alternate heat spreader configuration is shown in FIG. 3, where a heat spreader 140' is integrated with an active component 120'. In this case, the active component 120' can be configured to form sidewalls 144', 145', and microfins 160', such as by increasing silicon material thickness. A top plate or cover 146' can be coupled to the active component 120' to define microchannels 160'. This configuration obviates the need for a solder material, braze material, adhesive material, or a viscous TIM between the active component 120' and the heat spreader 140'.

Referring again to FIGS. 1A and 1B, the thermal management component 130 can be thermally coupled to the active component 120 in any suitable manner, such as with a viscous thermal interface material (TIM) disposed between the heat spreader and the active component at 121, a solder material, a braze material, and/or an adhesive (e.g., thermal adhesive) material. In one embodiment, the heat spreader 140 can have a channel base that includes the fins 160 and is constructed of aluminum, and a cover made of copper that is soldered, brazed, and/or bonded to the channel base. The copper cover can be thermally coupled to the active component 120 by a solder material, a braze material, an adhesive (e.g., thermal adhesive) material, or a viscous TIM.

In one aspect, the heat transfer fins 150 can be directly coupled to the heat spreader 140. For example, the fins 150 can be fixed to the heat spreader 140 with any suitable structural, solidified interface material, such as a solder material, a braze material, and/or an adhesive material (e.g., thermal adhesive), etc. Thus, the fins 150 can be directly coupled to the heat spreader 140 without a layer of viscous TIM between the heat spreader 140 and the fins 150. In one embodiment, each of the fins 150 can directly contact the heat spreader along a fin edge portion, free of any viscous TIM. Optionally, the fins 150 can be coupled to (e.g., integrally formed with) a base 152, which directly contacts the heat spreader 140. In either case, the heat transfer fins 150 are considered to be directly coupled to the heat spreader 140 due, for example, to the absence of an intervening non-solid, non-structural TIM. In one embodiment, the fins 150 can be integrally formed with the top plate 146 of the heat spreader 140 as a monolithic structure. By avoiding the use of a highly variable and thermally resistive viscous TIM and associated interface surfaces typically utilized in such thermal connections, heat transfer can be improved through a direct physical and mechanical coupling of the heat spreader 140 and the fins 150. Directly coupling the heat spreader 140 and fins 150 to one another and creating a junction that is free of the viscous TIM found in typical thermal connections, the junction temperature can be reduced in some embodiments by about 10-12 degrees C., which can result in a gain of 30 W to 40 W of additional capability.

Figure 4:
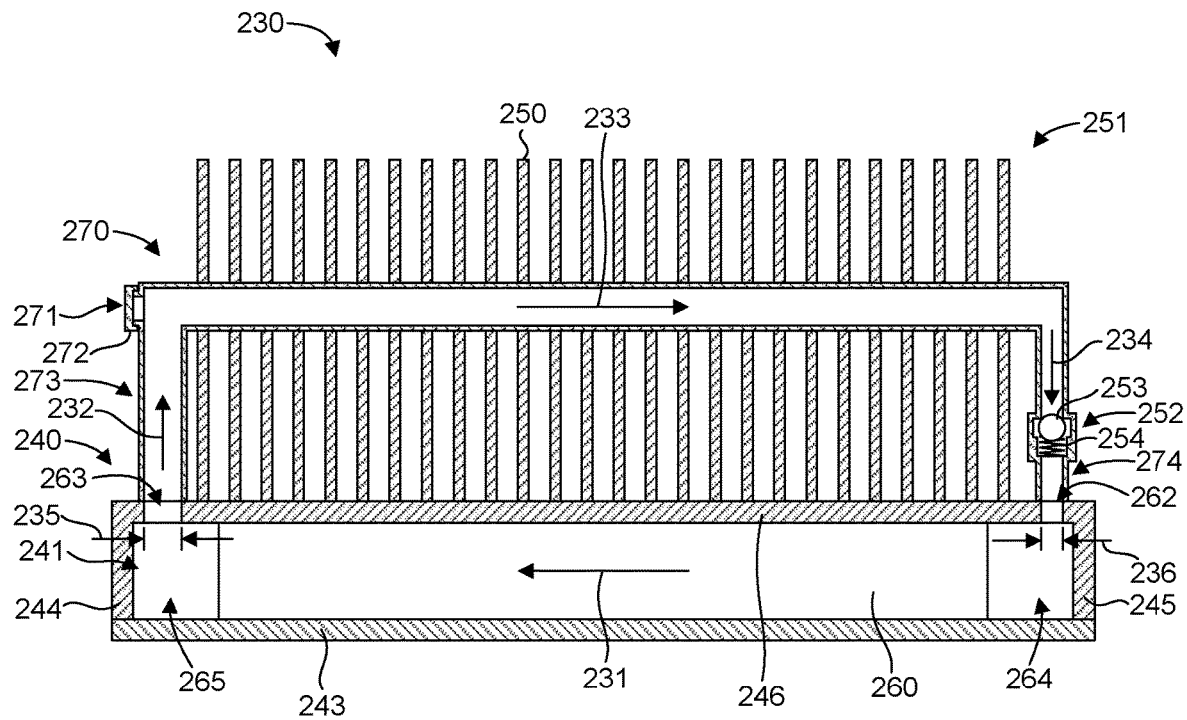
FIG. 4 illustrates a schematic cross-section of a thermal management component in accordance with an example embodiment.

FIG. 4 illustrates a thermal management component 230 in accordance with another example of the present disclosure. As with the thermal management component 130 discussed above with reference to FIGS. 1A and 1B, the thermal management component 230 can include a heat spreader 240, and one or more heat transfer fins 250 coupled to the heat spreader 240. The heat spreader 240 can include heat transfer fins (e.g., microfins) 260 and microchannels as described above, which are operable with a heat transfer fluid (not shown) to form a heat exchanger.

In the illustrated embodiment, the heat transfer fins 260 are disposed in a cavity 241 formed by a bottom plate 243, sidewalls 244, 245, and a top plate 246. The heat spreader 240 can include an inlet port 262 and an outlet port 263 in fluid communication with the microchannels to provide an entry and exit fluid path for heat transfer fluid through the heat spreader 240. The inlet and outlet ports 262, 263 can be in any suitable location, such as formed in the top plate 246 as illustrated, or optionally in the bottom plate 243 or sidewalls 244, 245 as desired. In one aspect, the cavity 241 and fins 260 can be configured to provide an inlet reservoir 264 and an outlet reservoir 265 at opposite lateral ends of the fins 260. The inlet port 262 can be in direct fluid communication with the inlet reservoir 264, and the outlet port 263 can be in direct fluid communication with the outlet reservoir 265. The inlet reservoir 264 can serve as a manifold to distribute fluid into the microchannels, and the outlet reservoir 265 can serve as a manifold to collect fluid that exits the microchannels.

The thermal management component 230 can also include a fluid conduit 270 fluidly coupled to the outlet port 263 and the inlet port 262 to facilitate flow of a heat transfer fluid into and out of the heat spreader 240 through the microchannels. The fluid conduit 270 can be thermally coupled to one or more of the heat transfer fins 250. For example, the fluid conduit 270 can be directly coupled to one or more of the fins 250, such as fixed with a structural, solidified interface material (e.g., a solder material, a braze material, and/or an adhesive material, etc.). In one aspect, the fluid conduit 270 can define a fluid path that passes through one or more of the fins 250. For example, the fluid conduit 270 can pass through holes or openings in the fins 250 and can be soldered, brazed, and/or bonded to the fins 250. In some embodiments, the fluid conduit 270 is oriented perpendicular to the fins 250, although other angles or relationships are contemplated. The fluid conduit 270 can have any suitable configuration or structure and can be made of any suitable material (e.g., aluminum, copper, steel, etc.). In some embodiments, the fluid conduit 270 comprises one or more tubes.

In operation, heat from an active component (not shown) is transferred by conduction to the bottom plate 243, sidewalls 244, 245, top plate 246, and microfins 260, which convectively heats liquid heat transfer fluid in the microchannels causing the fluid to boil and undergo a phase change from liquid to gas at 231. Gaseous or "hot" heat transfer fluid exits the outlet port 263 of the heat spreader 240 and passes through the fluid conduit 270 at 232. The gaseous heat transfer fluid is directed past or through the heat transfer fins 250 where the fluid convectively transfers heat to the fluid conduit 270, which conducts heat to the fins 250 acting as a radiator for convection to ambient air. Air may be blown past or through the fins 250 by a fan (not shown). The heat transfer fluid is cooled sufficient to condense and undergo a phase change from gas to liquid at 233. Liquid or "cold" heat transfer fluid is directed back toward the heat spreader 240 at 234 and into the heat spreader 240 via the inlet port 262 where heat transfer fluid can be heated again in the microchannels and the cycle repeats. The fluid conduit 270 and the heat spreader 240 can therefore form a closed loop for the heat transfer fluid. In this configuration, the heat spreader 240 may be referred to as an evaporator, and the fluid conduit 270, heat transfer fins 250, and associated components may be referred to as a condenser assembly 251.

In one aspect, heat transfer fluid can be caused to move about the closed loop thermal management component 230 by natural or passive circulation without a pump or other powered device, in contrast to forced circulation provided by a pump or other powered device. In natural or passive circulation, the different temperatures in the heat spreader 240 and the fluid conduit 270 proximate the fins 250 causes natural convection heating and cooling of the heat transfer fluid that results in different fluid densities, which creates pressure differences in the fluid that causes circulation of the fluid through the heat spreader 240 and the fluid conduit 270. Thus, with natural or passive circulation, no pump is required and the vaporization and condensation cycle is self-sustaining, unaided or unassisted by a pump.

In one aspect, the thermal management component 230, particularly the heat spreader 240 and the fins 250, can serve to dissipate a certain amount of heat (e.g., at relatively low processor power) even before any benefit is realized by the vaporization and condensation cycle of the heat transfer fluid described above. In this case, a direct coupling of the fins 250 and the heat spreader 240 can provide efficient conductive heat transfer between the heat spreader 240 and the fins 250, which in turn convectively transfer heat to the ambient air, sufficient to cool an active component up to a certain point before the temperature of the heat transfer fluid has increased to the point that the fluid boils or vaporizes. Once boiling of the heat transfer fluid occurs (e.g., at higher power levels), additional cooling benefits can be realized. Thus, the thermal management component 230 can provide two-stage cooling operation for an active component.

The thermal management component 230 can be "charged" with heat transfer fluid via a fluid charge port 271 in fluid communication with the fluid conduit 270. In some cases, a vacuum may be applied prior to charging with heat transfer fluid. A check valve (not shown) can be optionally included and associated with the charge port 271 to prevent unwanted loss of vacuum prior to charging or escape of heat transfer fluid following charging and prior to sealing the charge port with a cap 272.

In one aspect, the thermal management component 230 can be configured to provide one-way flow of the heat transfer fluid in a predefined direction and minimize or eliminate the possibility of reverse flow through the system. In one embodiment, one-way flow can be achieved by configuring structures in the fluid flow path to have different diameters. For example, a portion 273 of the fluid conduit 270 proximate a side of the fins 250 can have a diameter 235, and a portion 274 of the fluid conduit 270 proximate another or opposite side of the fins 250 can have a diameter 236. In addition, or as an alternative, the outlet port 263 orifice can be sized with the diameter 235 and the inlet port 262 orifice can be sized with the diameter 236. The diameter 235 can be greater than the diameter 236 to facilitate one-way flow of the heat transfer fluid out of the heat spreader 240 via the outlet port 263 and into the heat spreader 240 via the inlet port 262 by providing an easier flow path with less resistance in in the direction of the outlet port 263.

In one embodiment, one-way flow can be achieved by including a check valve or one-way valve 252, such as in the fluid conduit 270, to facilitate one-way flow of the heat transfer fluid out of the heat spreader 240 via the outlet port 263 and into the heat spreader 240 via the inlet port 262. The check valve 252 can also minimize or eliminate heat leakage. Any suitable check valve or one-way valve configuration can be utilized. In the illustrated embodiment, the check valve 252 is proximate the inlet port 262 and has a spring-loaded stopper configuration where fluid is prevented from flowing out of the heat spreader 240 via the inlet port 262. A stopper 253 is biased by a spring 254 to a normally closed valve position. The spring 254 can be configured to cause the stopper 253 to block the flow of fluid from the condenser assembly 251 to the heat spreader 240 via the inlet port 262 until a predetermined pressure acting on the stopper 253 has been reached, at which point the pressure overcomes the spring force and opens the valve. The pressure acting on the stopper 253 can be due to the liquid pressure proximate the check valve 252 and/or the weight of the fluid in the fluid conduit 270 supported by the stopper 253 and the spring 254. The charge port 271 and the check valve 252 can be included in the condenser assembly 251.

Figure 5:
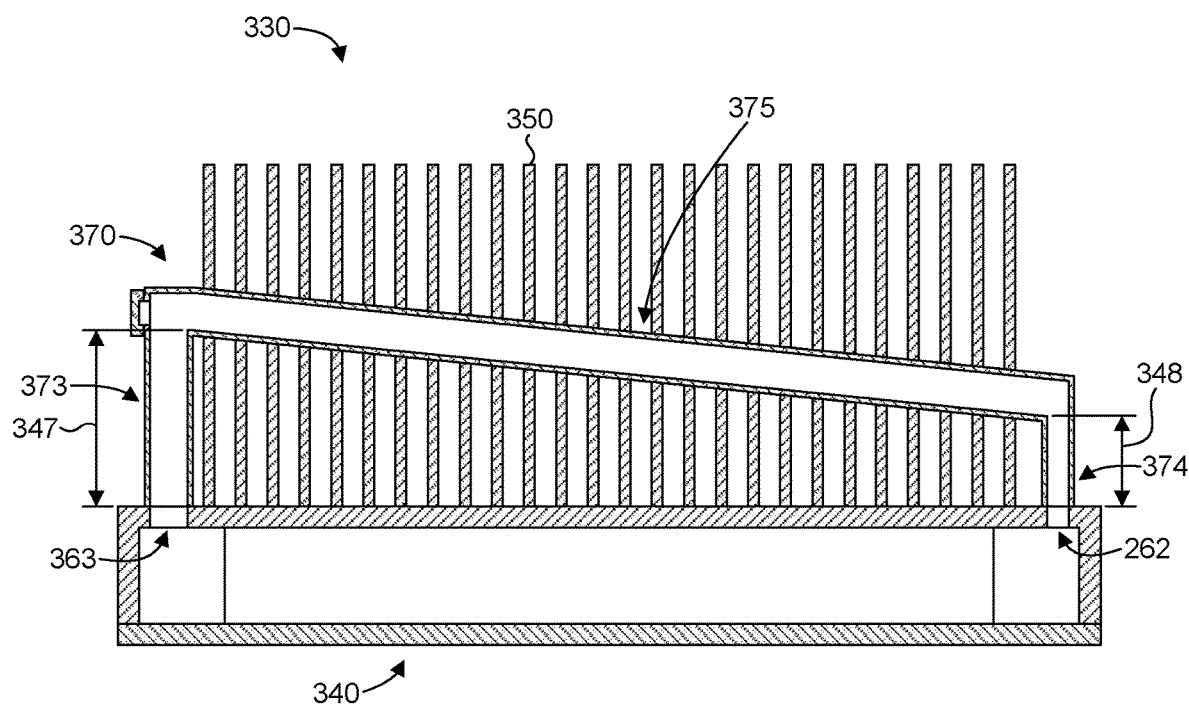
FIG. 5 illustrates a schematic cross-section of a thermal management component in accordance with an example embodiment.
Figure 6A:
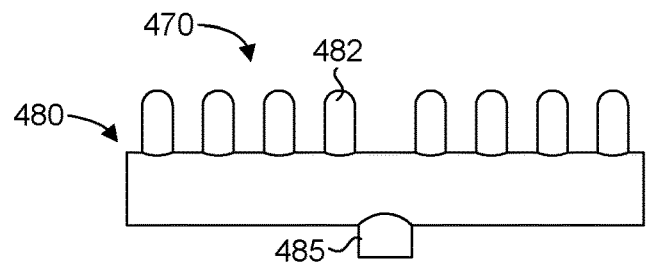
FIGS. 6A-6D illustrate a fluid conduit in accordance with an example embodiment.
Figure 6B:
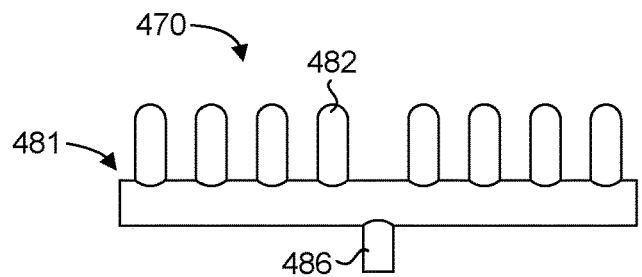
Figure 6C:
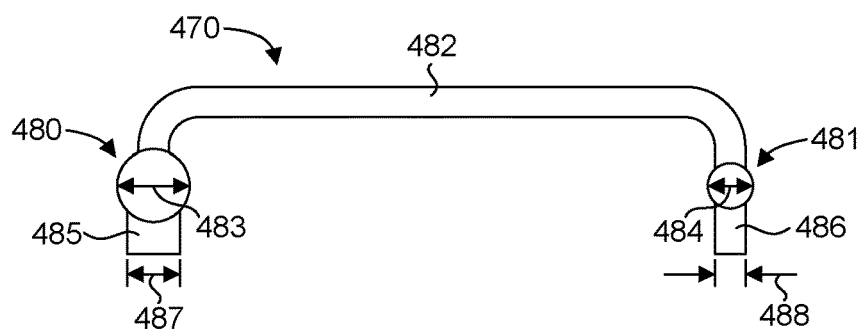
Figure 6D:
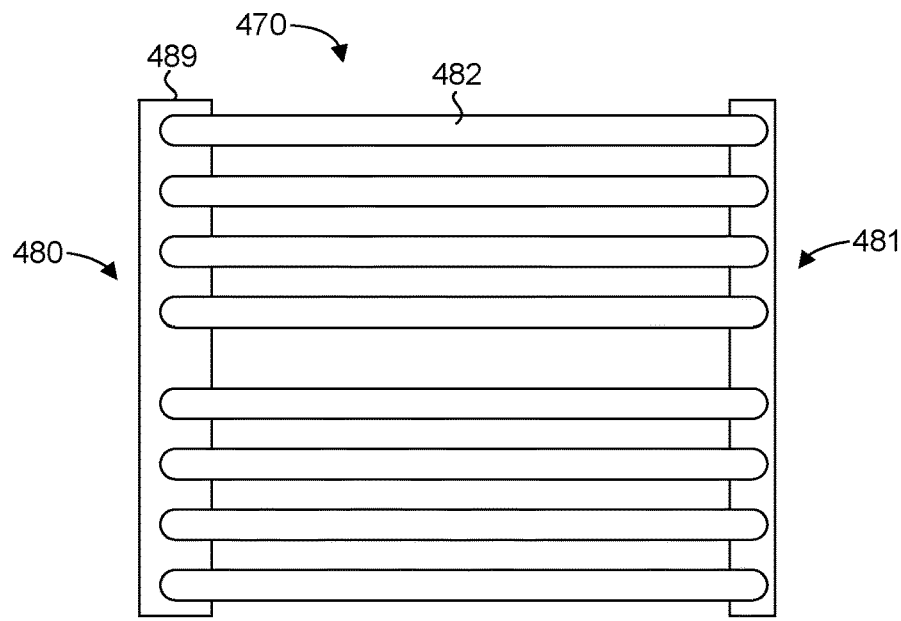

In one embodiment, shown in FIG. 5, one-way flow can be achieved by utilizing gravity to induce flow in a desired direction. In this case, a thermal management component 330 can have a fluid conduit 370 with a portion 373 proximate a side of fins 350 at a distance 347 from a heat spreader 340, and a portion 374 proximate another or opposite side of the fins 350 at a distance 348 from the heat spreader 340. The portion 373 of the fluid conduit 370 can be associated with an outlet port 363 of the heat spreader 340, and the portion 374 of the fluid conduit 370 can be associated with an inlet port 362 of the heat spreader 340. The distance 347 can be greater than the distance 348, which can angle a top or cross portion 375 of the fluid conduit 370 to facilitate gravity-induced one-way flow of heat transfer fluid out of the heat spreader 340 via the outlet port 363 and into the heat spreader 340 via the inlet port 362. Thus, the configuration and orientation of certain portions of the fluid conduit 370 can be such that gravity can assist in directing the fluid flow toward the inlet port 362.

FIGS. 6A-6D illustrate a fluid conduit 470 in accordance with an example of the present disclosure. In this embodiment, the fluid conduit 470 includes an outlet manifold 480, an inlet manifold 481, and a plurality of tubes 482 fluidly coupled to the outlet manifold 480 and the inlet manifold 481 in a parallel (in contrast to a series) configuration. Although not shown with other components of a thermal management component, the outlet manifold 480 can be in fluid communication with an outlet port of a heat spreader, and the inlet manifold 481 can be in fluid communication with an inlet port of a heat spreader. In some embodiments, one or more of the tubes 482 can extend through one or more fins of a condenser assembly. The fluid conduit 470 can include any suitable number of tubes 482, which may be in any suitable arrangement relative to one another. The tubes 482 can be of any suitable size, shape, or configuration.

The outlet and inlet manifolds 480, 481 can be any size, shape, or configuration. In one embodiment, the outlet manifold 480 and the inlet manifold 481 can have different diameters 483, 484, respectively, configured to influence the direction of fluid flow, as described above. The outlet and inlet manifolds 480, 481 can include respective stub tubes 485, 486 configured to interface and couple with a heat spreader, such as by soldering, brazing, bonding, etc. The stub tubes 485, 486 can be any size, shape, or configuration. In one embodiment, the outlet manifold stub tube 485 and the inlet manifold stub tube 486 can have different diameters 487, 488, respectively, configured to influence the direction of fluid flow, as described above. Manifold and stub tube diameters for a given inlet or outlet side may or may not be the same.

In some embodiments, a condenser assembly can include the fluid conduit 470 coupled to condenser fins. Other features or components that may be included in a condenser assembly, such as a charge port and a check valve as described above, can be incorporated into or in fluid communication with the inlet manifold and/or outlet manifold, as desired. For example, a charge port can be formed in an end wall of a manifold (e.g., in end wall 489 of the outlet manifold 480 in FIG. 6D). A check valve can be located between the inlet manifold 481 and an inlet port of a heat spreader. In this case, the check valve can be coupled to the inlet manifold stub tube 486, and the check valve can be configured to couple directly to the head spreader at an inlet port or couple to an intermediate component configured to do so.

In one aspect, the design of a condenser can be changed (i.e., enlarged or reduced in one or more dimensions) depending upon the available space surrounding an electronic device or package without affecting thermal performance (e.g., by modifying manifold and/or tubing configurations). The condenser can therefore be modified without changing heat spreader geometry to fit in any available space. Thus, a thermal management component as disclosed herein can increase the power capability of a processor in the same form factor or accommodate higher TDP processors.

A thermal management component disclosed herein can include a heat spreader configured as an evaporator, which can have a very high effective thermal conductivity coupling to an air-cooled condenser that can be integrated with the evaporator for passive, closed loop operation. Thus, the thermal management components disclosed herein provide air-cooled thermal solutions that utilize internal, self-contained heat transfer fluid for more efficient operation and improved performance that can enable high TDP cooling capability.

FIGS. 7A-7D schematically illustrate aspects of exemplary methods or processes for making an electronic device, including aspects of making a thermal management component, such as the thermal management component 230.

Figure 7A:
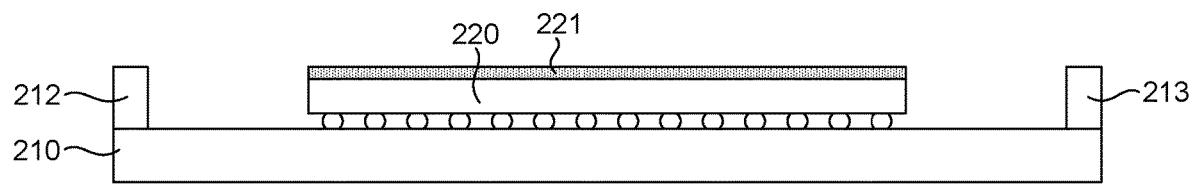
FIGS. 7A-7D illustrate aspects of a method for making an electronic device and a thermal management component in accordance with an example embodiment.

FIG. 7A illustrates a side cross-sectional view of a substrate 210, which may be obtained as an initial step in the process. As described above, the substrate 210 can have any suitable configuration, such as including electrical routing features (e.g., pads, vias, and/or traces), and can be constructed of any suitable material. One or more active components 220 can also be mounted on the substrate 210 utilizing any suitable process or technique, such as a die attach process, a film cure process, wire bonding, solder bumping, etc. Walls 212, 213 or other suitable features configured to form an enclosure about the active component 220 can optionally be mounted on the substrate 210. A viscous TIM 221, solder material, braze material, adhesive, etc. may be disposed on the active component to facilitate thermally coupling the active component 220 to a thermal management component.

Figure 7B:
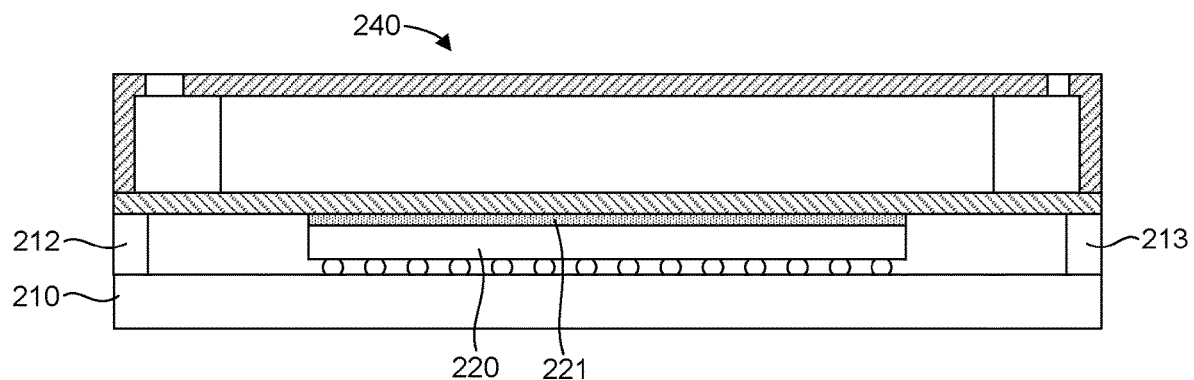

As shown in FIG. 7B, the heat spreader 240 can be thermally coupled to the active component 220, such as by contacting the viscous TIM 221, soldering, brazing, bonding, etc. The heat spreader 240 can also be mechanically coupled to the walls 212, 213, such as to form an enclosure about the active component 220. At this point, additional components can be coupled to the heat spreader 240 to configure an air-cooled thermal solution (i.e., a thermal management component as disclosed herein) or a forced liquid thermal solution. In other words, the heat spreader 240 can be configured for use in either thermal solution configuration, which provides some flexibility for manufacturing and meeting customer needs.

Figure 7C:
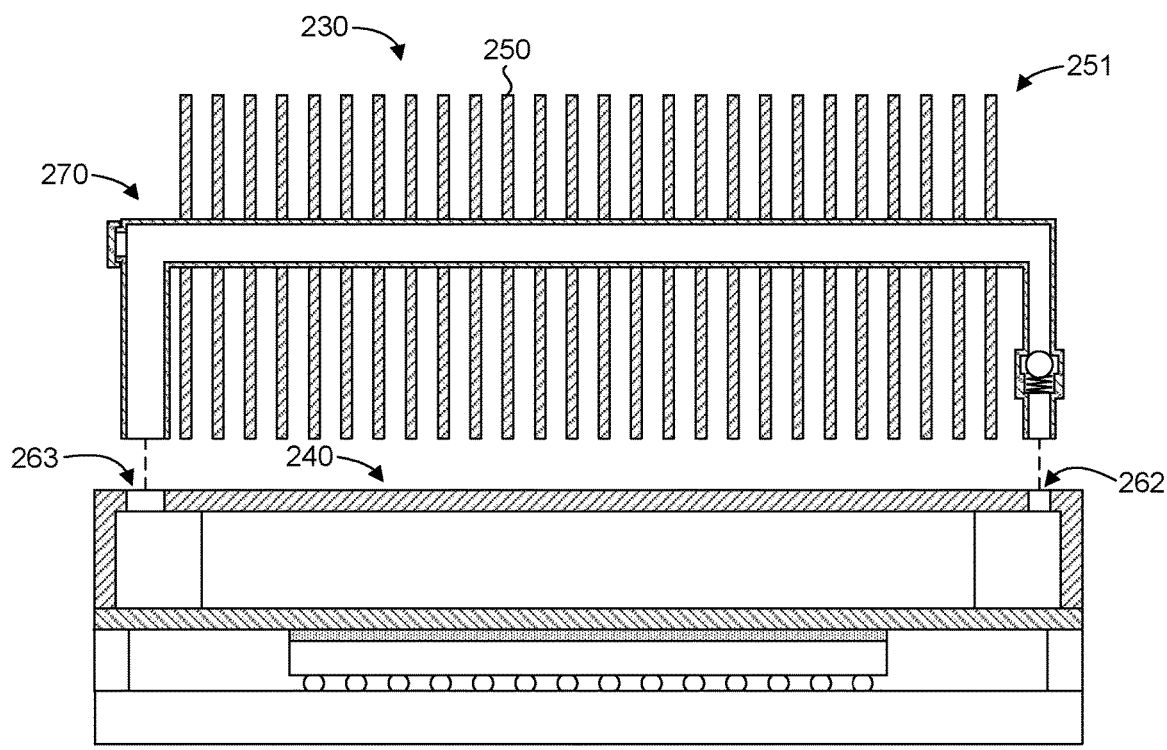

To provide an air-cooled thermal solution, the condenser assembly 251 can be coupled to the heat spreader 240, as shown in FIG. 7C, to form the thermal management component 230. The condenser assembly 251 can be constructed and assembled, as discussed above, prior to coupling with the heat spreader 240. The fluid conduit 270 can be fluidly coupled to the inlet and outlet ports 262, 263, such as by soldering, brazing, bonding, etc. In addition, the fins 250 can be thermally coupled to the heat spreader 240 (e.g., the top plate 246). In one aspect, the fins 250 can be directly coupled to the heat spreader 240, such as fixed to one another with a structural, solidifiable interface material (e.g., a solder material, a braze material, an adhesive material, etc.). In another aspect, the fins 250 can be thermally coupled to the heat spreader 240 via a viscous TIM.

Figure 7D:
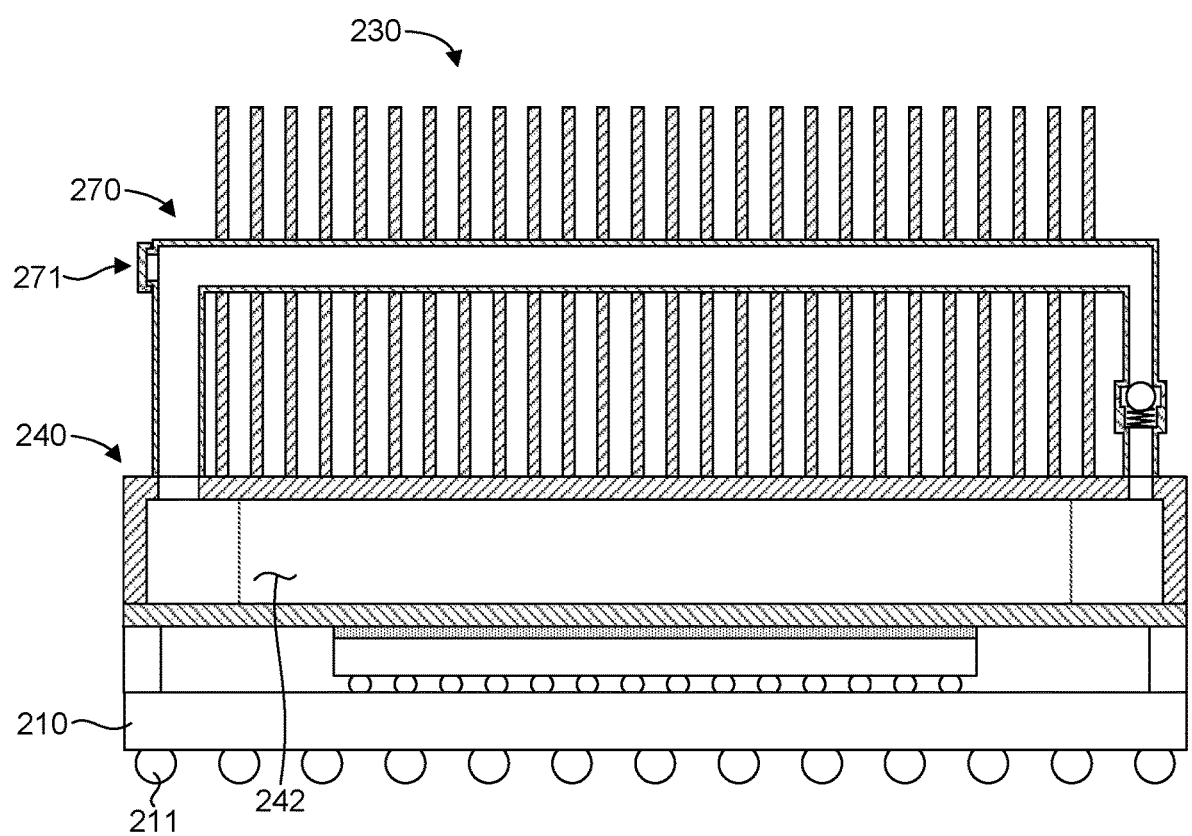

As shown in FIG. 7D, the thermal management component 230 can be charged via the charge port 271 with the heat transfer fluid 242, which can be disposed in the microchannels of the heat spreader 240 and, optionally, in the fluid conduit 270. A vacuum can be drawn on the system, as appropriate, to facilitate proper charging with heat transfer fluid 242.

As further shown in FIG. 7D, interconnect structures (e.g., such as solder balls 211) can be disposed on or coupled to a bottom side of the substrate 210 to facilitate electrically coupling with an external electronic component in order to arrive at a completed electronic device 200.

Figure 8:
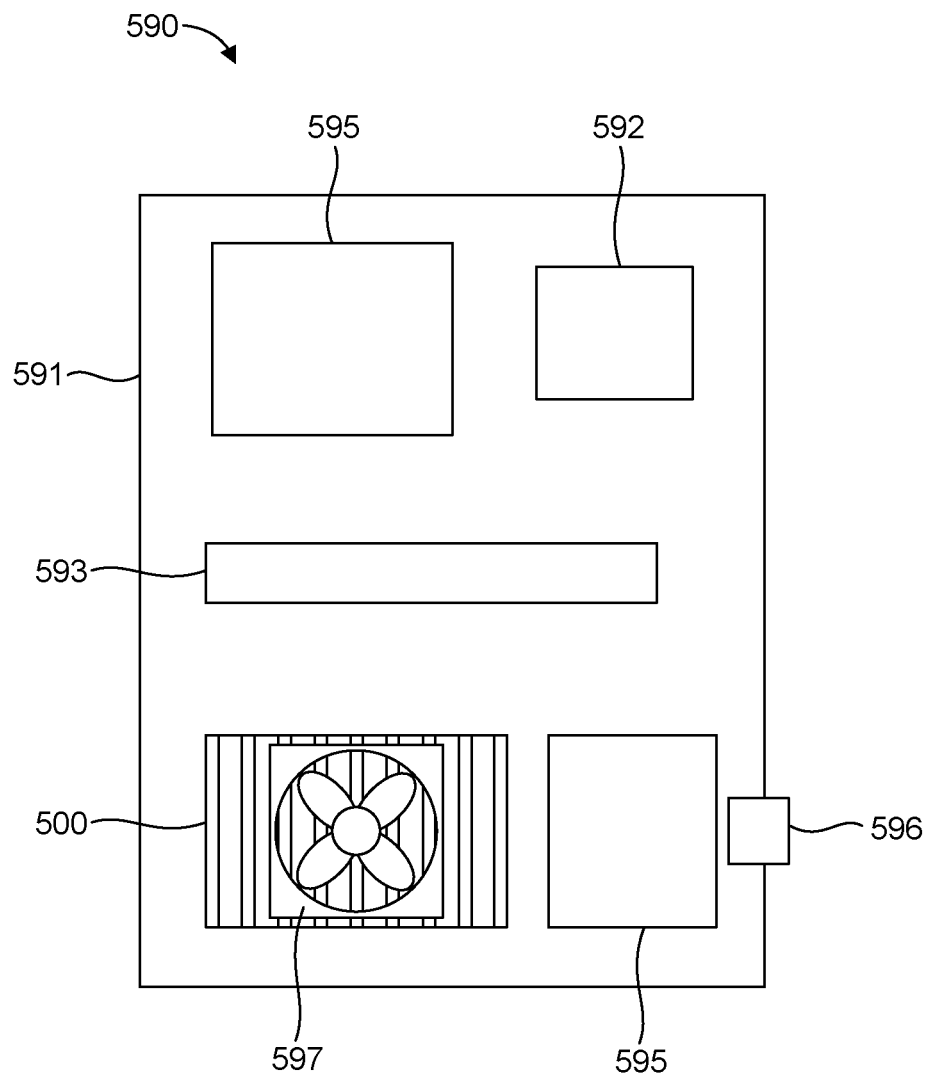
FIG. 8 is a schematic illustration of an exemplary computing system.

FIG. 8 schematically illustrates an example computing system 590. The computing system 590 can include an electronic device 500 as disclosed herein, operably coupled to a motherboard 591. In one aspect, the computing system 590 can also include a processor 592, a memory device 593, a radio 594, a cooling system (e.g., a heat sink and/or a heat spreader) 595, a port 596, a fan 597, a slot, or any other suitable device or component, which can be operably coupled to the motherboard 591. The fan 597 or similar device can be included to increase the flow of air or another fluid across heat transfer fins of the electronic device 500 to further enhance heat transfer. The computing system 590 can comprise any type of computing system, such as a portable computer, a desktop computer, a mobile telephone, a digital camera, a digital music player, a tablet computer, a personal digital assistant, a pager, an instant messaging device, a wearable electronic device, a server, a television, an audio/video streaming device, or other devices. Other embodiments need not include all of the features specified in FIG. 8, and may include alternative features not specified in FIG. 8.

Examples

The following examples pertain to further embodiments.

In one example, there is provided a thermal management component comprising a heat spreader having a plurality of microchannels, and a plurality of fins directly coupled to the heat spreader to provide surface area for heat transfer.

In one example of a thermal management component, the plurality of fins are fixed to the heat spreader with a structural, solidified interface material.

In one example of a thermal management component, the structural, solidified interface material comprises a solder material, a braze material, an adhesive material, or a combination thereof.

In one example of a thermal management component, each of the plurality of fins directly contacts the heat spreader along an edge portion.

In one example of a thermal management component, the heat spreader comprises a lid for an electronic device package, an integrated heat spreader (IHS), a vapor chamber, a heat exchanger, or a combination thereof.

In one example of a thermal management component, the heat spreader further comprises an inlet port and an outlet port, and further comprising a fluid conduit thermally coupled to the plurality of fins and fluidly coupled to the outlet port and the inlet port to facilitate flow of a heat transfer fluid through the microchannels and the fluid conduit.

In one example of a thermal management component, the fluid conduit defines a fluid path that passes through at least one of the plurality of fins.

In one example of a thermal management component, the fluid conduit is directly coupled to the at least one of the plurality of fins.

In one example of a thermal management component, the fluid conduit is fixed to the at least one of the plurality of fins with a structural, solidified interface material.

In one example of a thermal management component, the structural, solidified interface material comprises a solder material, a braze material, an adhesive material, or a combination thereof.

In one example of a thermal management component, the heat transfer fluid is operable to flow through the fluid conduit by natural circulation.

In one example of a thermal management component, the fluid conduit comprises a tube.

In one example of a thermal management component, the fluid conduit comprises a check valve to facilitate one-way flow of the fluid out of the heat spreader via the outlet port and into the heat spreader via the inlet port.

In one example of a thermal management component, the check valve is proximate the inlet port.

In one example of a thermal management component, a first portion of the fluid conduit proximate a first side of the plurality of fins is at a first distance from the heat spreader and a second portion of the fluid conduit proximate a second side of the plurality of fins is at a second distance from the heat spreader, and wherein the first distance is greater than the second distance to facilitate gravity-induced one-way flow of the heat transfer fluid out of the heat spreader via the outlet port and into the heat spreader via the inlet port.

In one example of a thermal management component, a first portion of the fluid conduit proximate a first side of the plurality of fins has a first diameter, and a second portion of the fluid conduit proximate a second side of the plurality of fins has a second diameter, and wherein the first diameter is greater than the second diameter to facilitate one-way flow of the heat transfer fluid out of the heat spreader via the outlet port and into the heat spreader via the inlet port.

In one example, a thermal management component comprises a fluid charge port in fluid communication with the fluid conduit.

In one example of a thermal management component, the fluid conduit comprises an outlet manifold in fluid communication with the outlet port, an inlet manifold in fluid communication with the inlet port, and a plurality of tubes fluidly coupled to the outlet manifold and the inlet manifold in a parallel configuration.

In one example of a thermal management component, at least one of the plurality of tubes extends through at least one of the plurality of fins.

In one example of a thermal management component, the heat spreader further comprises a channel base comprising a plurality of microfins that at least partially define the plurality of microchannels.

In one example of a thermal management component, the heat spreader further comprises a cover coupled to the channel base and operable with the plurality of microfins to define the plurality of microchannels.

In one example of a thermal management component, the plurality of fins are integrally formed with the channel base.

In one example, a thermal management component comprises a heat transfer fluid disposed in the plurality of microchannels.

In one example of a thermal management component, the heat transfer fluid is operable in use to undergo phase change between liquid and gas.

In one example of a thermal management component, the heat transfer fluid comprises water.

In one example, there is provided a thermal management component comprising a heat spreader having a plurality of microchannels, and an inlet port and an outlet port in fluid communication with the plurality of microchannels, a plurality of fins coupled to the heat spreader to provide surface area for heat transfer, and a fluid conduit thermally coupled to the plurality of fins and fluidly coupled to the outlet port and the inlet port to facilitate flow of a heat transfer fluid through the microchannels and the fluid conduit.

In one example of a thermal management component, the plurality of fins are directly coupled to the heat spreader.

In one example of a thermal management component, the plurality of fins are fixed to the heat spreader with a structural, solidified interface material.

In one example of a thermal management component, the structural, solidified interface material comprises a solder material, a braze material, an adhesive material, or a combination thereof.

In one example of a thermal management component, each of the plurality of fins directly contacts the heat spreader along an edge portion.

In one example of a thermal management component, the heat spreader comprises a lid for an electronic device package, an integrated heat spreader (IHS), a vapor chamber, a heat exchanger, or a combination thereof.

In one example of a thermal management component, the fluid conduit defines a fluid path that passes through at least one of the plurality of fins.

In one example of a thermal management component, the fluid conduit is directly coupled to the at least one of the plurality of fins.

In one example of a thermal management component, the fluid conduit is fixed to the at least one of the plurality of fins with a structural, solidified interface material.

In one example of a thermal management component, the structural, solidified interface material comprises a solder material, a braze material, an adhesive material, or a combination thereof.

In one example of a thermal management component, the heat transfer fluid is operable to flow through the fluid conduit by natural circulation.

In one example of a thermal management component, the fluid conduit comprises a tube.

In one example of a thermal management component, the fluid conduit comprises a check valve to facilitate one-way flow of the fluid out of the heat spreader via the outlet port and into the heat spreader via the inlet port.

In one example of a thermal management component, the check valve is proximate the inlet port.

In one example of a thermal management component, a first portion of the fluid conduit proximate a first side of the plurality of fins is at a first distance from the heat spreader and a second portion of the fluid conduit proximate a second side of the plurality of fins is at a second distance from the heat spreader, and wherein the first distance is greater than the second distance to facilitate gravity-induced one-way flow of the heat transfer fluid out of the heat spreader via the outlet port and into the heat spreader via the inlet port.

In one example of a thermal management component, a first portion of the fluid conduit proximate a first side of the plurality of fins has a first diameter, and a second portion of the fluid conduit proximate a second side of the plurality of fins has a second diameter, and wherein the first diameter is greater than the second diameter to facilitate one-way flow of the heat transfer fluid out of the heat spreader via the outlet port and into the heat spreader via the inlet port.

In one example, a thermal management component comprises a fluid charge port in fluid communication with the fluid conduit.

In one example of a thermal management component, the fluid conduit comprises an outlet manifold in fluid communication with the outlet port, an inlet manifold in fluid communication with the inlet port, and a plurality of tubes fluidly coupled to the outlet manifold and the inlet manifold in a parallel configuration.

In one example of a thermal management component, at least one of the plurality of tubes extends through at least one of the plurality of fins.

In one example of a thermal management component, the heat spreader further comprises a channel base comprising a plurality of microfins that at least partially define the plurality of microchannels.

In one example of a thermal management component, the heat spreader further comprises a cover coupled to the channel base and operable with the plurality of microfins to define the plurality of microchannels.

In one example of a thermal management component, the plurality of fins are integrally formed with the channel base.

In one example, a thermal management component comprises the heat transfer fluid disposed in the plurality of microchannels.

In one example of a thermal management component, the heat transfer fluid is operable in use to undergo phase change between liquid and gas.

In one example of a thermal management component, the heat transfer fluid comprises water.

In one example, there is provided an electronic device comprising a substrate; an active component mounted on the substrate, the active component being operable to generate heat due to resistance of electric current, and a thermal management component thermally coupled to the active component, the thermal management component including a heat spreader having a plurality of microchannels, and a plurality of fins directly coupled to the heat spreader to provide surface area for heat transfer.

In one example of an electronic device, the thermal management component is thermally coupled to the active component with a thermal interface material (TIM) disposed between the heat spreader and the active component.

In one example of an electronic device, the thermal management component is thermally coupled to the active component with a solder material, a braze material, an adhesive material, or a combination thereof.

In one example of an electronic device, the plurality of fins are fixed to the heat spreader with a structural, solidified interface material.

In one example of an electronic device, the structural, solidified interface material comprises a solder material, a braze material, an adhesive material, or a combination thereof.

In one example of an electronic device, each of the plurality of fins directly contacts the heat spreader along an edge portion.

In one example of an electronic device, the heat spreader comprises a lid for an electronic device package, an integrated heat spreader (IHS), a vapor chamber, a heat exchanger, or a combination thereof.

In one example of an electronic device, the heat spreader further comprises an inlet port and an outlet port, and further comprising a fluid conduit thermally coupled to the plurality of fins and fluidly coupled to the outlet port and the inlet port to facilitate flow of a heat transfer fluid through the microchannels and the fluid conduit.

In one example of an electronic device, the fluid conduit defines a fluid path that passes through at least one of the plurality of fins.

In one example of an electronic device, the fluid conduit is directly coupled to the at least one of the plurality of fins.

In one example of an electronic device, the fluid conduit is fixed to the at least one of the plurality of fins with a structural, solidified interface material.

In one example of an electronic device, the structural, solidified interface material comprises a solder material, a braze material, an adhesive material, or a combination thereof.

In one example of an electronic device, the heat transfer fluid is operable to flow through the fluid conduit by natural circulation.

In one example of an electronic device, the fluid conduit comprises a tube.

In one example of an electronic device, the fluid conduit comprises a check valve to facilitate one-way flow of the fluid out of the heat spreader via the outlet port and into the heat spreader via the inlet port.

In one example of an electronic device, the check valve is proximate the inlet port.

In one example of an electronic device, a first portion of the fluid conduit proximate a first side of the plurality of fins is at a first distance from the heat spreader and a second portion of the fluid conduit proximate a second side of the plurality of fins is at a second distance from the heat spreader, and wherein the first distance is greater than the second distance to facilitate gravity-induced one-way flow of the heat transfer fluid out of the heat spreader via the outlet port and into the heat spreader via the inlet port.

In one example of an electronic device, a first portion of the fluid conduit proximate a first side of the plurality of fins has a first diameter, and a second portion of the fluid conduit proximate a second side of the plurality of fins has a second diameter, and wherein the first diameter is greater than the second diameter to facilitate one-way flow of the heat transfer fluid out of the heat spreader via the outlet port and into the heat spreader via the inlet port.

In one example, an electronic device comprises a fluid charge port in fluid communication with the fluid conduit.

In one example of an electronic device, the fluid conduit comprises an outlet manifold in fluid communication with the outlet port, an inlet manifold in fluid communication with the inlet port, and a plurality of tubes fluidly coupled to the outlet manifold and the inlet manifold in a parallel configuration.

In one example of an electronic device, at least one of the plurality of tubes extends through at least one of the plurality of fins.

In one example of an electronic device, the heat spreader further comprises a channel base comprising a plurality of microfins that at least partially define the plurality of microchannels.

In one example of an electronic device, the heat spreader further comprises a cover coupled to the channel base and operable with the plurality of microfins to define the plurality of microchannels.

In one example of an electronic device, the plurality of fins are integrally formed with the channel base.

In one example of an electronic device, the active component comprises a plurality of microfins that at least partially define the plurality of microchannels.

In one example of an electronic device, the heat spreader further comprises a cover coupled to the active component and operable with the plurality of microfins to define the plurality of microchannels.

In one example of an electronic device, the plurality of fins are integrally formed with the cover.

In one example, an electronic device comprises a heat transfer fluid disposed in the plurality of microchannels.

In one example of an electronic device, the heat transfer fluid is operable in use to undergo phase change between liquid and gas.

In one example of an electronic device, the heat transfer fluid comprises water.

In one example, there is provided an electronic device comprising a substrate, an active component mounted on the substrate, the active component being operable to generate heat due to resistance of electric current, and a thermal management component thermally coupled to the active component, the thermal management component including a heat spreader having a plurality of microchannels, and an inlet port and an outlet port in fluid communication with the plurality of microchannels, a plurality of fins coupled to the heat spreader to provide surface area for heat transfer, and a fluid conduit thermally coupled to the plurality of fins and fluidly coupled to the outlet port and the inlet port to facilitate flow of a heat transfer fluid through the microchannels and the fluid conduit.

In one example of an electronic device, the thermal management component is thermally coupled to the active component with a thermal interface material (TIM) disposed between the heat spreader and the active component.

In one example of an electronic device, the thermal management component is thermally coupled to the active component with a solder material, a braze material, an adhesive material, or a combination thereof.

In one example of an electronic device, the plurality of fins are directly coupled to the heat spreader.

In one example of an electronic device, the plurality of fins are fixed to the heat spreader with a structural, solidified interface material.

In one example of an electronic device, the structural, solidified interface material comprises a solder material, a braze material, an adhesive material, or a combination thereof.

In one example of an electronic device, each of the plurality of fins directly contacts the heat spreader along an edge portion.

In one example of an electronic device, the heat spreader comprises a lid for an electronic device package, an integrated heat spreader (IHS), a vapor chamber, a heat exchanger, or a combination thereof.

In one example of an electronic device, the fluid conduit defines a fluid path that passes through at least one of the plurality of fins.

In one example of an electronic device, the fluid conduit is directly coupled to the at least one of the plurality of fins.

In one example of an electronic device, the fluid conduit is fixed to the at least one of the plurality of fins with a structural, solidified interface material.

In one example of an electronic device, the structural, solidified interface material comprises a solder material, a braze material, an adhesive material, or a combination thereof.

In one example of an electronic device, the heat transfer fluid is operable to flow through the fluid conduit by natural circulation.

In one example of an electronic device, the fluid conduit comprises a tube.

In one example of an electronic device, the fluid conduit comprises a check valve to facilitate one-way flow of the fluid out of the heat spreader via the outlet port and into the heat spreader via the inlet port.

In one example of an electronic device, the check valve is proximate the inlet port.

In one example of an electronic device, a first portion of the fluid conduit proximate a first side of the plurality of fins is at a first distance from the heat spreader and a second portion of the fluid conduit proximate a second side of the plurality of fins is at a second distance from the heat spreader, and wherein the first distance is greater than the second distance to facilitate gravity-induced one-way flow of the heat transfer fluid out of the heat spreader via the outlet port and into the heat spreader via the inlet port.

In one example of an electronic device, a first portion of the fluid conduit proximate a first side of the plurality of fins has a first diameter, and a second portion of the fluid conduit proximate a second side of the plurality of fins has a second diameter, and wherein the first diameter is greater than the second diameter to facilitate one-way flow of the heat transfer fluid out of the heat spreader via the outlet port and into the heat spreader via the inlet port.

In one example, an electronic device comprises a fluid charge port in fluid communication with the fluid conduit.

In one example of an electronic device, the fluid conduit comprises an outlet manifold in fluid communication with the outlet port, an inlet manifold in fluid communication with the inlet port, and a plurality of tubes fluidly coupled to the outlet manifold and the inlet manifold in a parallel configuration.

In one example of an electronic device, at least one of the plurality of tubes extends through at least one of the plurality of fins.

In one example of an electronic device, the heat spreader further comprises a channel base comprising a plurality of microfins that at least partially define the plurality of microchannels.

In one example of an electronic device, the heat spreader further comprises a cover coupled to the channel base and operable with the plurality of microfins to define the plurality of microchannels.

In one example of an electronic device, the plurality of fins are integrally formed with the channel base.

In one example of an electronic device, the active component comprises a plurality of microfins that at least partially define the plurality of microchannels.

In one example of an electronic device, the heat spreader further comprises a cover coupled to the active component and operable with the plurality of microfins to define the plurality of microchannels.

In one example of an electronic device, the plurality of fins are integrally formed with the cover.

In one example, an electronic device comprises the heat transfer fluid disposed in the plurality of microchannels.

In one example of an electronic device, the heat transfer fluid is operable in use to undergo phase change between liquid and gas.

In one example of an electronic device, the heat transfer fluid comprises water.

In one example, there is provided a computing system comprising a motherboard and an electronic device operably coupled to the motherboard, the electronic device comprising a substrate; an active component mounted on the substrate, the active component being operable to generate heat due to resistance of electric current, and a thermal management component thermally coupled to the active component, the thermal management component including a heat spreader having a plurality of microchannels, and a plurality of fins directly coupled to the heat spreader to provide surface area for heat transfer.

In one example, there is provided a computing system comprising a motherboard and an electronic device operably coupled to the motherboard, the electronic device comprising a substrate, an active component mounted on the substrate, the active component being operable to generate heat due to resistance of electric current, and a thermal management component thermally coupled to the active component, the thermal management component including a heat spreader having a plurality of microchannels, and an inlet port and an outlet port in fluid communication with the plurality of microchannels, a plurality of fins coupled to the heat spreader to provide surface area for heat transfer, and a fluid conduit thermally coupled to the plurality of fins and fluidly coupled to the outlet port and the inlet port to facilitate flow of a heat transfer fluid through the microchannels and the fluid conduit.

In one example of a computing system, the computing system comprises a portable computer, a desktop computer, a mobile telephone, a digital camera, a digital music player, a tablet computer, a personal digital assistant, a pager, an instant messaging device, a wearable electronic device, a server, a television, an audio/video streaming device, or other devices, or a combination thereof.

In one example of a computing system, the computing system further comprises a processor, a memory device, a cooling system, a fan, a radio, a slot, a port, or a combination thereof operably coupled to the motherboard.

In one example, there is provided a method for making a thermal management component comprising obtaining a heat spreader having a plurality of microchannels, and directly coupling a plurality of fins to the heat spreader to provide surface area for heat transfer.

In one example of a method for making a thermal management component, the plurality of fins are fixed to the heat spreader with a structural, solidifiable interface material.

In one example of a method for making a thermal management component, the structural, solidifiable interface material comprises a solder material, a braze material, an adhesive material, or a combination thereof.

In one example of a method for making a thermal management component, each of the plurality of fins directly contacts the heat spreader along an edge portion.

In one example of a method for making a thermal management component, the heat spreader comprises a lid for an electronic device package, an integrated heat spreader (IHS), a vapor chamber, a heat exchanger, or a combination thereof.

In one example of a method for making a thermal management component, the heat spreader further comprises an inlet port and an outlet port in fluid communication with the plurality of microchannels, and further comprising thermally coupling a fluid conduit to the plurality of fins, and fluidly coupling the fluid conduit to the outlet port and the inlet port to facilitate the flow of a heat transfer fluid through the microchannels and the fluid conduit.

In one example of a method for making a thermal management component, the fluid conduit defines a fluid path that passes through at least one of the plurality of fins.

In one example of a method for making a thermal management component, the fluid conduit is directly coupled to the at least one of the plurality of fins.

In one example of a method for making a thermal management component, the fluid conduit is fixed to the at least one of the plurality of fins with a structural, solidified interface material.

In one example of a method for making a thermal management component, the structural, solidified interface material comprises a solder material, a braze material, an adhesive material, or a combination thereof.

In one example of a method for making a thermal management component, the heat transfer fluid is operable to flow through the fluid conduit by natural circulation.

In one example of a method for making a thermal management component, the fluid conduit comprises a tube.

In one example of a method for making a thermal management component, the fluid conduit comprises a check valve to facilitate one-way flow of the fluid out of the heat spreader via the outlet port and into the heat spreader via the inlet port.

In one example of a method for making a thermal management component, the check valve is proximate the inlet port.

In one example of a method for making a thermal management component, a first portion of the fluid conduit proximate a first side of the plurality of fins is at a first distance from the heat spreader and a second portion of the fluid conduit proximate a second side of the plurality of fins is at a second distance from the heat spreader, and wherein the first distance is greater than the second distance to facilitate gravity-induced one-way flow of the heat transfer fluid out of the heat spreader via the outlet port and into the heat spreader via the inlet port.

In one example of a method for making a thermal management component, a first portion of the fluid conduit proximate a first side of the plurality of fins has a first diameter, and a second portion of the fluid conduit proximate a second side of the plurality of fins has a second diameter, and wherein the first diameter is greater than the second diameter to facilitate one-way flow of the heat transfer fluid out of the heat spreader via the outlet port and into the heat spreader via the inlet port.

In one example, a method for making a thermal management component comprises fluidly coupling a fluid charge port to the fluid conduit.

In one example of a method for making a thermal management component, the fluid conduit comprises an outlet manifold in fluid communication with the outlet port, an inlet manifold in fluid communication with the inlet port, and a plurality of tubes fluidly coupled to the outlet manifold and the inlet manifold in a parallel configuration.

In one example of a method for making a thermal management component, at least one of the plurality of tubes extends through at least one of the plurality of fins.

In one example of a method for making a thermal management component, the heat spreader further comprises a channel base comprising a plurality of microfins that at least partially define the plurality of microchannels.

In one example of a method for making a thermal management component, the heat spreader further comprises a cover coupled to the channel base and operable with the plurality of microfins to define the plurality of microchannels.

In one example of a method for making a thermal management component, the plurality of fins are integrally formed with the channel base.

In one example, a method for making a thermal management component comprises disposing a heat transfer fluid within the plurality of microchannels.

In one example of a method for making a thermal management component, the heat transfer fluid is operable in use to undergo phase change between liquid and gas.

In one example of a method for making a thermal management component, the heat transfer fluid comprises water.

In one example, there is provided a method for making a thermal management component comprising obtaining a heat spreader having a plurality of microchannels, and an inlet port and an outlet port in fluid communication with the plurality of microchannels, coupling a plurality of fins to the heat spreader to provide surface area for heat transfer, thermally coupling a fluid conduit to the plurality of fins, and fluidly coupling the fluid conduit to the outlet port and the inlet port to facilitate flow of a heat transfer fluid through the microchannels and the fluid conduit.

In one example of a method for making a thermal management component, the plurality of fins are directly coupled to the heat spreader.

In one example of a method for making a thermal management component, the plurality of fins are fixed to the heat spreader with a structural, solidifiable interface material.

In one example of a method for making a thermal management component, the structural, solidifiable interface material comprises a solder material, a braze material, an adhesive material, or a combination thereof.

In one example of a method for making a thermal management component, each of the plurality of fins directly contacts the heat spreader along an edge portion.

In one example of a method for making a thermal management component, the heat spreader comprises a lid for an electronic device package, an integrated heat spreader (IHS), a vapor chamber, a heat exchanger, or a combination thereof.

In one example of a method for making a thermal management component, the fluid conduit defines a fluid path that passes through at least one of the plurality of fins.

In one example of a method for making a thermal management component, the fluid conduit is directly coupled to the at least one of the plurality of fins.

In one example of a method for making a thermal management component, the fluid conduit is fixed to the at least one of the plurality of fins with a structural, solidifiable interface material.

In one example of a method for making a thermal management component, the structural, solidifiable interface material comprises a solder material, a braze material, an adhesive material, or a combination thereof.

In one example of a method for making a thermal management component, the heat transfer fluid is operable to flow through the fluid conduit by natural circulation.

In one example of a method for making a thermal management component, the fluid conduit comprises a tube.

In one example of a method for making a thermal management component, the fluid conduit comprises a check valve to facilitate one-way flow of the fluid out of the heat spreader via the outlet port and into the heat spreader via the inlet port.

In one example of a method for making a thermal management component, the check valve is proximate the inlet port.

In one example of a method for making a thermal management component, a first portion of the fluid conduit proximate a first side of the plurality of fins is at a first distance from the heat spreader and a second portion of the fluid conduit proximate a second side of the plurality of fins is at a second distance from the heat spreader, and wherein the first distance is greater than the second distance to facilitate gravity-induced one-way flow of the heat transfer fluid out of the heat spreader via the outlet port and into the heat spreader via the inlet port.

In one example of a method for making a thermal management component, a first portion of the fluid conduit proximate a first side of the plurality of fins has a first diameter, and a second portion of the fluid conduit proximate a second side of the plurality of fins has a second diameter, and wherein the first diameter is greater than the second diameter to facilitate one-way flow of the heat transfer fluid out of the heat spreader via the outlet port and into the heat spreader via the inlet port.

In one example, a method for making a thermal management component comprises fluidly coupling a fluid charge port to the fluid conduit.

In one example of a method for making a thermal management component, the fluid conduit comprises an outlet manifold in fluid communication with the outlet port, an inlet manifold in fluid communication with the inlet port, and a plurality of tubes fluidly coupled to the outlet manifold and the inlet manifold in a parallel configuration.

In one example of a method for making a thermal management component, at least one of the plurality of tubes extends through at least one of the plurality of fins.

In one example of a method for making a thermal management component, the heat spreader further comprises a channel base comprising a plurality of microfins that at least partially define the plurality of microchannels.

In one example of a method for making a thermal management component, the heat spreader further comprises a cover coupled to the channel base and operable with the plurality of microfins to define the plurality of microchannels.

In one example of a method for making a thermal management component, the plurality of fins are integrally formed with the channel base.

In one example, a method for making a thermal management component comprises disposing the heat transfer fluid in the plurality of microchannels.

In one example of a method for making a thermal management component, the heat transfer fluid is operable in use to undergo phase change between liquid and gas.

In one example of a method for making a thermal management component, the heat transfer fluid comprises water.

Circuitry used in electronic components or devices (e.g. a die) of an electronic device package can include hardware, firmware, program code, executable code, computer instructions, and/or software. Electronic components and devices can include a non-transitory computer readable storage medium which can be a computer readable storage medium that does not include signal. In the case of program code execution on programmable computers, the computing devices recited herein may include a processor, a storage medium readable by the processor (including volatile and non-volatile memory and/or storage elements), at least one input device, and at least one output device. Volatile and non-volatile memory and/or storage elements may be a RAM, EPROM, flash drive, optical drive, magnetic hard drive, solid state drive, or other medium for storing electronic data. Node and wireless devices may also include a transceiver module, a counter module, a processing module, and/or a clock module or timer module. One or more programs that may implement or utilize any techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

While the forgoing examples are illustrative of the specific embodiments in one or more particular applications, it will be apparent to those of ordinary skill in the art that numerous modifications in form, usage and details of implementation can be made without departing from the principles and concepts articulated herein.

What is claimed is:

1. A thermal management component, comprising:
   a heat spreader having a plurality of microchannels, an inlet port, and an outlet port;

a plurality of fins directly coupled to the heat spreader to provide surface area for heat transfer; and a fluid conduit thermally coupled to the plurality of fins and defining a fluid path that passes through at least one of the plurality of fins, the fluid conduit being fluidly coupled to the outlet port and the inlet port to facilitate flow of a heat transfer fluid through the microchannels and the fluid conduit by natural circulation.

2. The thermal management component of claim 1, wherein the plurality of fins are fixed to the heat spreader with a structural, solidified interface material.

3. The thermal management component of claim 1, wherein each of the plurality of fins directly contacts the heat spreader along an edge portion.

4. The thermal management component of claim 1, wherein the heat spreader is configured as at least one of a lid for an electronic device package, an integrated heat spreader (IHS), a vapor chamber, or a heat exchanger.

5. The thermal management component of claim 1, wherein the fluid conduit comprises a check valve to facilitate one-way flow of the fluid out of the heat spreader via the outlet port and into the heat spreader via the inlet port.

6. The thermal management component of claim 1, further comprising a fluid charge port in fluid communication with the fluid conduit.

7. The thermal management component of claim 1, wherein the fluid conduit comprises:
   an outlet manifold in fluid communication with the outlet port;
   an inlet manifold in fluid communication with the inlet port; and
   a plurality of tubes fluidly coupled to the outlet manifold and the inlet manifold in a parallel configuration.

8. The thermal management component of claim 1, wherein the heat spreader further comprises a channel base comprising a plurality of microfins that at least partially define the plurality of microchannels.

9. The thermal management component of claim 1, further comprising a heat transfer fluid disposed in the plurality of microchannels.

10. An electronic device, comprising:
   a substrate;
   an active component mounted on the substrate, the active component being operable to generate heat due to resistance of electric current; and
   a thermal management component thermally coupled to the active component, the thermal management component including
      a heat spreader having a plurality of microchannels, an inlet port, and an outlet port,
      a plurality of fins directly coupled to the heat spreader to provide surface area for heat transfer, and
      a fluid conduit thermally coupled to the plurality of fins and defining a fluid path that passes through at least one of the plurality of fins, the fluid conduit being fluidly coupled to the outlet port and the inlet port to facilitate flow of a heat transfer fluid through the microchannels and the fluid conduit by natural circulation.

11. The electronic device of claim 10, wherein the thermal management component is thermally coupled to the active component with a thermal interface material (TIM) disposed between the heat spreader and the active component.

12. The electronic device of claim 10, wherein the thermal management component is thermally coupled to the active component with a solder material, a braze material, an adhesive material, or a combination thereof.

13. The electronic device of claim 10, wherein the plurality of fins are fixed to the heat spreader with a structural, solidified interface material.

14. The electronic device of claim 10, wherein each of the plurality of fins directly contacts the heat spreader along an edge portion.

15. The electronic device of claim 10, wherein the heat spreader is configured as at least one of a lid for an electronic device package, an integrated heat spreader (IHS), a vapor chamber, or a heat exchanger.

16. The electronic device of claim 10, wherein the heat spreader further comprises an inlet port and an outlet port, and further comprising a fluid conduit thermally coupled to the plurality of fins and fluidly coupled to the outlet port and the inlet port to facilitate flow of a heat transfer fluid through the microchannels and the fluid conduit.

17. The electronic device of claim 10, wherein the active component comprises a plurality of microfins that at least partially define the plurality of microchannels.

18. The electronic device of claim 10, further comprising a heat transfer fluid disposed in the plurality of microchannels.

* * * * *